(12) United States Patent
Mantri et al.

(10) Patent No.: US 6,906,563 B2
(45) Date of Patent: Jun. 14, 2005

(54) GENERATING A WAVEFORM HAVING ONE SIGNAL LEVEL PERIODICALLY AND DIFFERENT SIGNAL LEVELS IN OTHER DURATIONS

(75) Inventors: Rajiv Shrikant Mantri, Bangalore (IN); Vineet Mishra, Bangalore (IN); Vinod Paliakara, Bangalore (IN); Asif Soyebali Surti, Mumbai (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/654,086

(22) Filed: Sep. 4, 2003

(65) Prior Publication Data

US 2005/0052207 A1 Mar. 10, 2005

(51) Int. Cl.$^7$ .................................................. H03K 4/06
(52) U.S. Cl. .......................... 327/134; 327/99; 327/130
(58) Field of Search ................................ 327/124–128, 327/130, 134, 164, 165, 170, 99, 172–175, 180, 407; 716/4, 6

(56) References Cited

U.S. PATENT DOCUMENTS

| | | | | |
|---|---|---|---|---|
| 5,025,172 A | * | 6/1991 | Carroll et al. | 327/130 |
| 5,376,830 A | * | 12/1994 | Ashley et al. | 327/134 |
| 5,434,529 A | * | 7/1995 | Shou et al. | 327/436 |
| 5,652,536 A | * | 7/1997 | Nookala et al. | 327/298 |
| 5,825,223 A | * | 10/1998 | Mader | 327/170 |
| 6,111,440 A | * | 8/2000 | Rajagopalan et al. | 327/137 |
| 6,218,887 B1 | * | 4/2001 | Brown | 327/408 |
| 6,239,626 B1 | * | 5/2001 | Chesavage | 327/99 |
| 6,429,698 B1 | * | 8/2002 | Young | 327/99 |
| 6,452,425 B1 | * | 9/2002 | Gregorian et al. | 327/99 |
| 6,529,237 B1 | * | 3/2003 | Tsay et al. | 348/241 |
| 6,631,257 B1 | * | 10/2003 | White et al. | 455/333 |
| 6,631,507 B2 | * | 10/2003 | Shih et al. | 716/6 |
| 6,791,607 B1 | * | 9/2004 | Bilhan et al. | 348/243 |

* cited by examiner

*Primary Examiner*—Tuan T. Lam
*Assistant Examiner*—Hai L. Nguyen
(74) *Attorney, Agent, or Firm*—W. Daniel Swayze, Jr.; W. James Brady; Frederick J. Telecky, Jr.

(57) ABSTRACT

Generating a waveform having one signal level periodically and different signal levels in other durations. Two input signals are received, one having a desired constant level and another having desired signal levels. The desired output waveform is generated by selecting one of the two input signals. As a result, the output waveform may be generated to have (transitions) with high frequency even if the signal levels between adjacent portions are substantially different. Such waveforms are useful to test CDS (correlated double sampling) samplers.

15 Claims, 5 Drawing Sheets

GENERATING A WAVEFORM HAVING ONE SIGNAL LEVEL PERIODICALLY AND DIFFERENT SIGNAL LEVELS IN OTHER DURATIONS

BACKGROUND OF THE INVENTION

1. Field of the Invention

The present invention relates to generation of electrical waveforms, and more specifically to a method and apparatus for generating a waveform having one signal level periodically and different signal levels in other durations.

2. Related Art

There is often a need to generate an electrical waveform having one signal level periodically and different signal levels in other durations. For example, in a technique known as correlated double sampling (CDS), the value of an information element (digital value or analog signal strength) is encoded as a difference of a fixed signal level transmitted during one duration (e.g., phase of a clock signal) and another signal level transferred during an adjacent duration.

Thus, when a sequence of information elements are to be represented, the corresponding waveform generally has a fixed signal level in alternative durations, and the signal level of the waveform in the remaining durations depends on the specific information element sought to be represented.

CDS is used in several technologies such as image capturing/processing (e.g., in a camera), in which each pixel of a charge coupled device (CCD) captures the light intensity of a corresponding point of an image in the form of charge, and the light intensity of successive points is transmitted in the form of a waveform represented using CDS. A CDS sampler may convert the waveform portions into successive voltage levels, which are then converted into digital samples by an analog to digital converter (ADC), as is well known in the relevant arts.

One example scenario in which such an electrical waveform may need to be generated is in testing a CDS sampler, and the desired waveform may be referred to as a CCD waveform. It may be desirable to test the CDS sampler for all possible voltage output levels (as represented by ramp output 104 in FIG. 1A). The corresponding input signal to the CDS sampler is shown as CCD waveform 103. In FIG. 1A, CDS waveform 103 is shown at fixed voltage 105 during alternate durations 101, and the desired voltage levels are shown represented in remaining durations 102. Thus, it may be desirable to generate a waveform such as CCD waveform 103.

In one approach of generating CCD waveform 103, a sequence of digital values are provided as an input to a digital-to-analog converter (DAC), with alternative digital values corresponding to fixed voltage 105. The remaining digital values are designed to respectively equal the voltage levels desired in durations 102. The DAC converts each received digital value to corresponding voltage level, and the output of the DAC represents CCD waveform 103.

One problem with such an approach is that a DAC may require a substantial amount of time ("settling time") to settle at a final voltage level, particularly when the difference between successive durations is high (e.g., right after time point 106). The higher settling times are particularly problematic when a CDS sampler needs to operate at high speed (e.g., with a time period of less than 30 nano-seconds) and/or with high resolution (e.g., 12 bit resolution) because higher speed implies the length of durations 101 and 102 is short and higher resolution implies that the waveform is to have settled to a corresponding degree of closeness to the final level quickly.

At least for such reasons, an improved approach may be desirable to generate a waveform having one signal level periodically and different signal levels in other durations.

SUMMARY OF THE INVENTION

A waveform generator implemented according to an aspect of the present invention receives a first input signal having a constant level and a second signal having different levels in other durations, and selects the first input signal periodically and the second signal in other durations to generate a desired waveform.

A multiplexor may be employed for such a selection. In one embodiment, the multiplexor a first switch and a second switch respectively coupled to receive the first input signal and the second input signal, the first switch being operated to be in a closed state periodically (e.g., in alternative cycles) and the second switch being operated to be in the closed state in the other durations.

The two switches may be implemented using core transistors having a low breakdown voltage and high switching speeds. As a result, the waveform generator may be used to generate waveforms of high frequency. In addition, due to the use of the two input signals, the waveform can be generated with a high resolution as well.

In an embodiment, the desired waveform may correspond to a CCD waveform. Accordingly, the second signal may correspond to a ramp signal. The CCD waveform may be used to test a CDS (correlated double sampling) sampler at a high frequency.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the following accompanying drawings.

DETAILED DESCRIPTION OF THE PREFERRED EMBODIMENTS

1. Overview

An aspect of the present invention enables generation of waveform having one signal level periodically and different signal levels during other durations. In an embodiment, a circuit receives a first input having a constant signal level (e.g., equaling the one signal level) and a second input having desired signal levels for the other durations. The circuit selects either the first input or the second input to generate the desired waveform.

By using two signal sources, one for generating the constant signal level another for generating the different signal, the desired waveform can be generated at least without some of the problems (potentially long settling time, etc.) noted in the background section above.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Environment

FIG. 1 is a block diagram illustrating the details of example environment 100 in which the present invention can be implemented. Example environment 100 is shown containing waveform generator 130, CDS (correlated double sampling) sampler 150, ADC (analog-to-digital converter) 170, and examination block 190. Each block is described below in further detail.

Figure 1A:
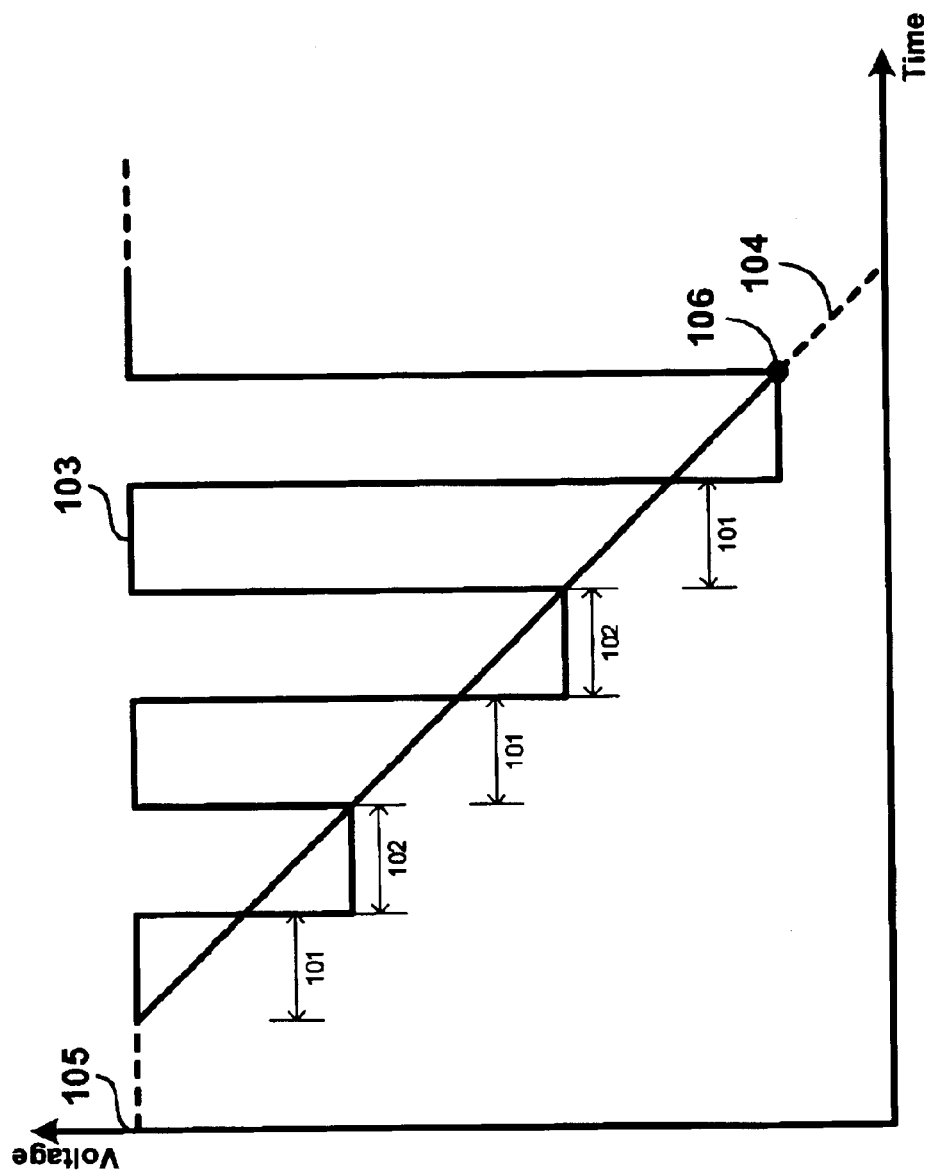
FIG. 1A is a timing diagram illustrating an example CCD waveform.
Figure 1B:
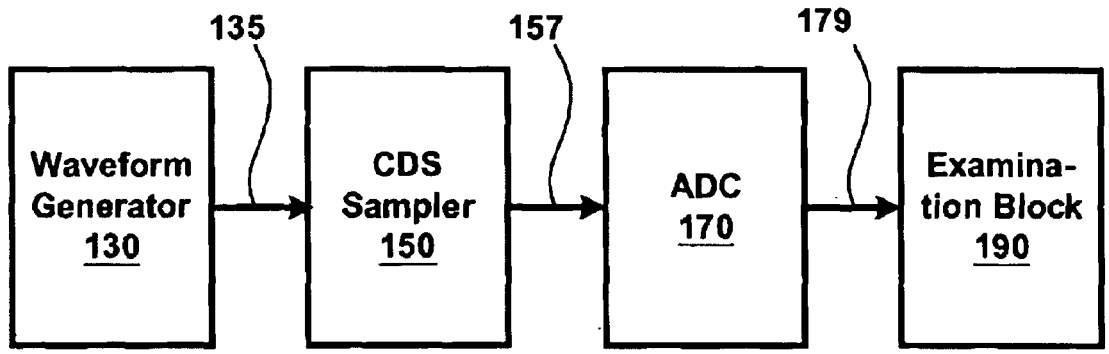
FIG. 1B is a block diagram illustrating the details of an example environment in which the present invention can be implemented.

Waveform generator 130, implemented according to an aspect of the present invention generates output signal 135, which is suitable for testing CDS sampler 150. With reference to FIG. 1A, output signal 135 may correspond to CCD waveform 103. The manner in which waveform generator 130 can be implemented is described below in further detail.

CDS sampler 150 samples output signal 135 according to CDS principles, and generates the resulting voltage signal on path 157. Thus, assuming that the input signal to CDS sampler 150 corresponds to CCD waveform 103, the output on path 157 may correspond to ramp 104, but with transitions in steps corresponding to the double sampling points.

ADC 170 samples each step generated on path 157, and generates the corresponding digital value. ADC 170 may be implemented in a known way. Examination block 190 examines the digital values to determine whether CDS sampler 150 is operating accurately, assuming that CCD generator 130 generates CCD waveform accurately. The manner in which waveforms such as CCD waveform 103 can be generated accurately is described below in further details with several examples.

3. Method

Figure 2:
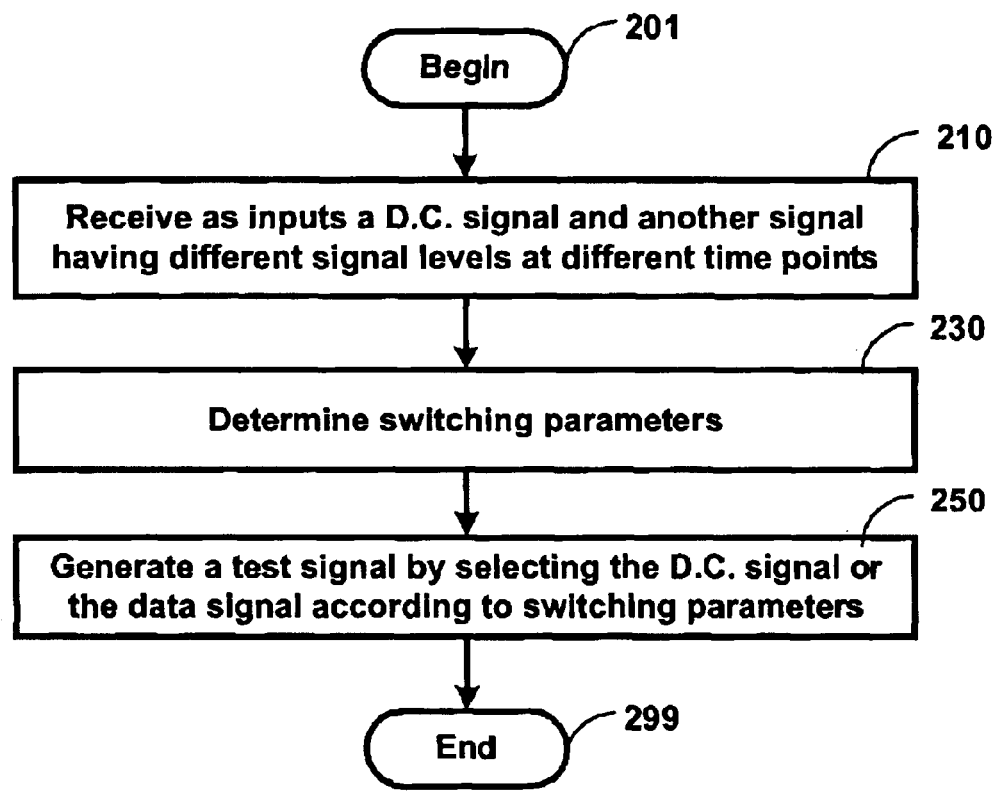
FIG. 2 is a flow-chart illustrating the details of a method using which a waveform having one signal level periodically and different signal levels in other durations may be generated according to an aspect of present invention.

FIG. 2 is a flow-chart illustrating the details of a method using which various waveforms may be generated according to an aspect of present invention. The method is described with reference to FIGS. 1A and 1B merely for illustration. However, the method may be implemented to generate several other waveforms in several other environments. For example, instead of just one constant level, a waveform may be generated which have two constant levels at different time portions, and variable levels in the remaining portions. The method begins in step 201, in which it immediately passes to step 210.

In step 210, two input signals are received, with one input signal containing a DC (constant voltage) signal and another signal having different signal levels at different time points. In the case of a CCD waveform encoding information elements, each information element is specified with reference to the DC signal, and thus the another signal contains a signal level corresponding to the information element encoded in a corresponding time duration.

In step 230, switching parameters indicating the specific time durations at which each of the two input signals is to be selected, are determined. With reference to the CCD waveform, the DC signal needs to be selected in alternative time durations, and the another signal needs to be selected during the remaining time durations. In general, the length of each duration depends on the frequency of operation of the CCD device being tested. In addition, the alternative time durations are designed to be contiguous such that a continuous waveform is generated below.

In step 250, waveform generator 130 generates a test signal by selecting one of the two input signals according to the switching parameters. The selection may be implemented using any of several approaches as is well known in the relevant arts. The method ends in step 299.

Thus, a test waveform having one signal level periodically and different signal levels during other durations may be generated according to an aspect of present invention. Several embodiments of waveform generator 130 are described below in further detail.

4. CCD Waveform Generator

Figure 3:
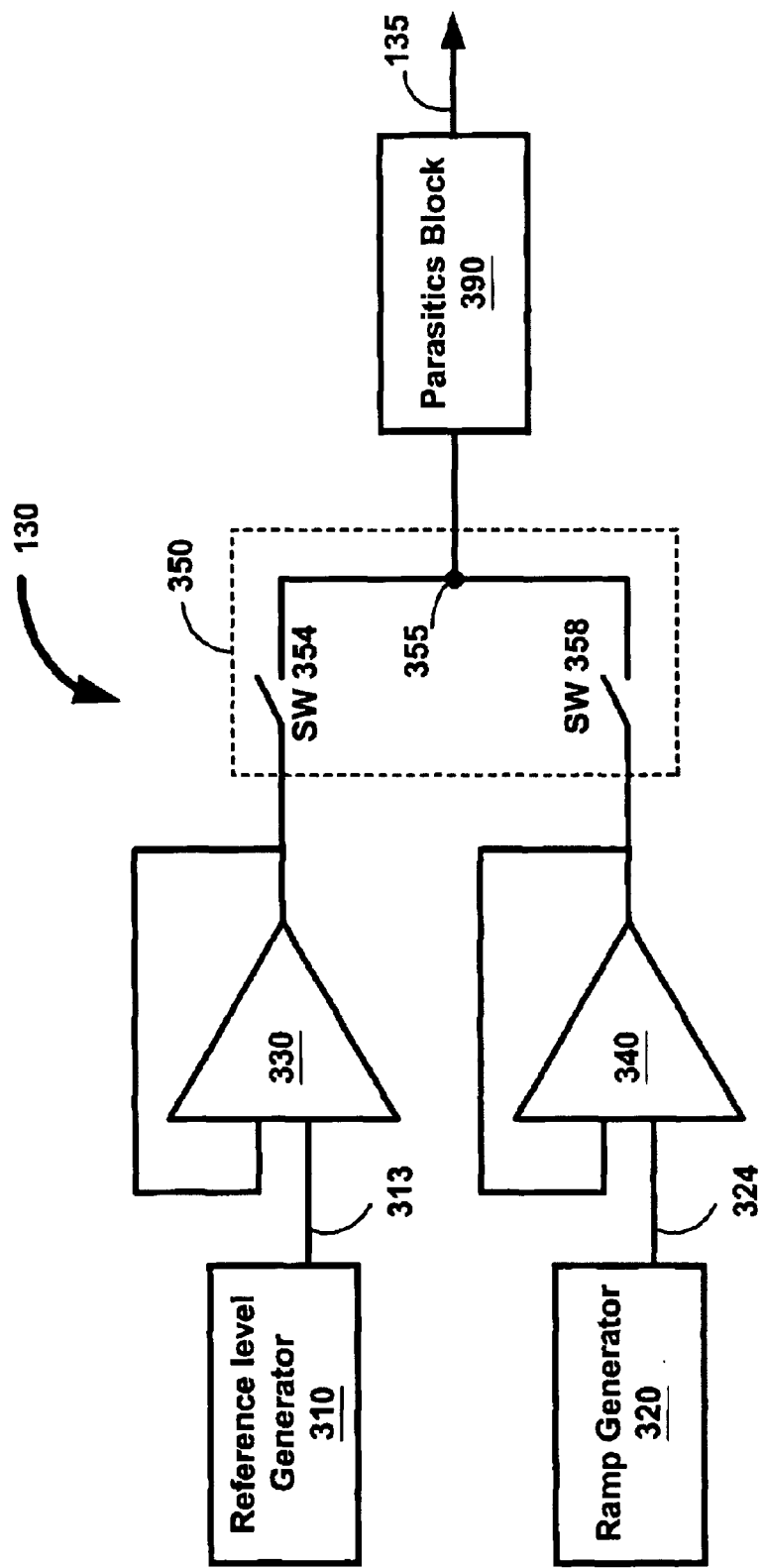
FIG. 3 is a block diagram illustrating a waveform generator according to an aspect of present invention.

FIG. 3 is a block diagram illustrating the details of a waveform generator according to an aspect of present invention. Waveform generator 130 is shown containing reference level generator 310, ramp generator 320, operational amplifiers 330 and 340, multiplexer 350, and parasitics block 390. Each block is described below in further detail.

Reference level generator 310 generates a fixed DC signal on path 313. A DC signal between 10 and 15 volts is commonly used for CCDs. Ramp generator 320 generates a linear ramp on path 324. DC signal and linear ramp may be generated using electronic circuits which will be apparent to one skilled in the relevant arts. It may be appreciated that other types of signals (having different signal levels at different time durations) may be generated on path 324 depending on the specific design requirements.

Operational amplifiers 330 and 340 are provided to isolate the reference level generator 310 and ramp generator 320 from surge and charge injection currents caused due to closing and opening of switches 354 and 358 (described below in further detail). Isolation of both signal generators from the respective switches maintains the outputs of the signal generators at desired levels.

Multiplexer 350 is shown containing switches SW 354 and SW 358, which respectively pass the output signal generated by operational amplifiers 330 and 340 when in a closed state. The time duration for which SW 354 and SW 358 close (or open) is determined by the frequency of operation of CDS sampler 150 being tested. In general, when one switch is on, the other switch if off such that the output waveform is entirely generated by sampling the two input signals. Multiplexor 350 may be implemented to select from the two input signals using other types of circuits as well.

Parasitics block 390 represents the impedances associated with the conducting paths within waveform generator 130 before the desired waveform is generated on path 135. Thus, the waveform generated by waveform generator 130 may be viewed as being subject to the corresponding impedances before being provided to CDS sampler 150.

As may be appreciated, the two input signals need not satisfy fast settling constraint, since the sources do not see the step changes in the output CCD signal. Precision high frequency sources which need not have good step settling may hence be used. Similarly, the selection operation may also be implemented at a high frequency. Thus, a CCD waveform may be implemented to support a high frequency of operation of CDS sampler 150. The description is continued with reference to a timing diagram further illustrating the operation of waveform generator 130 in example embodiment(s) described above.

5. Timing Diagram

Figure 4:
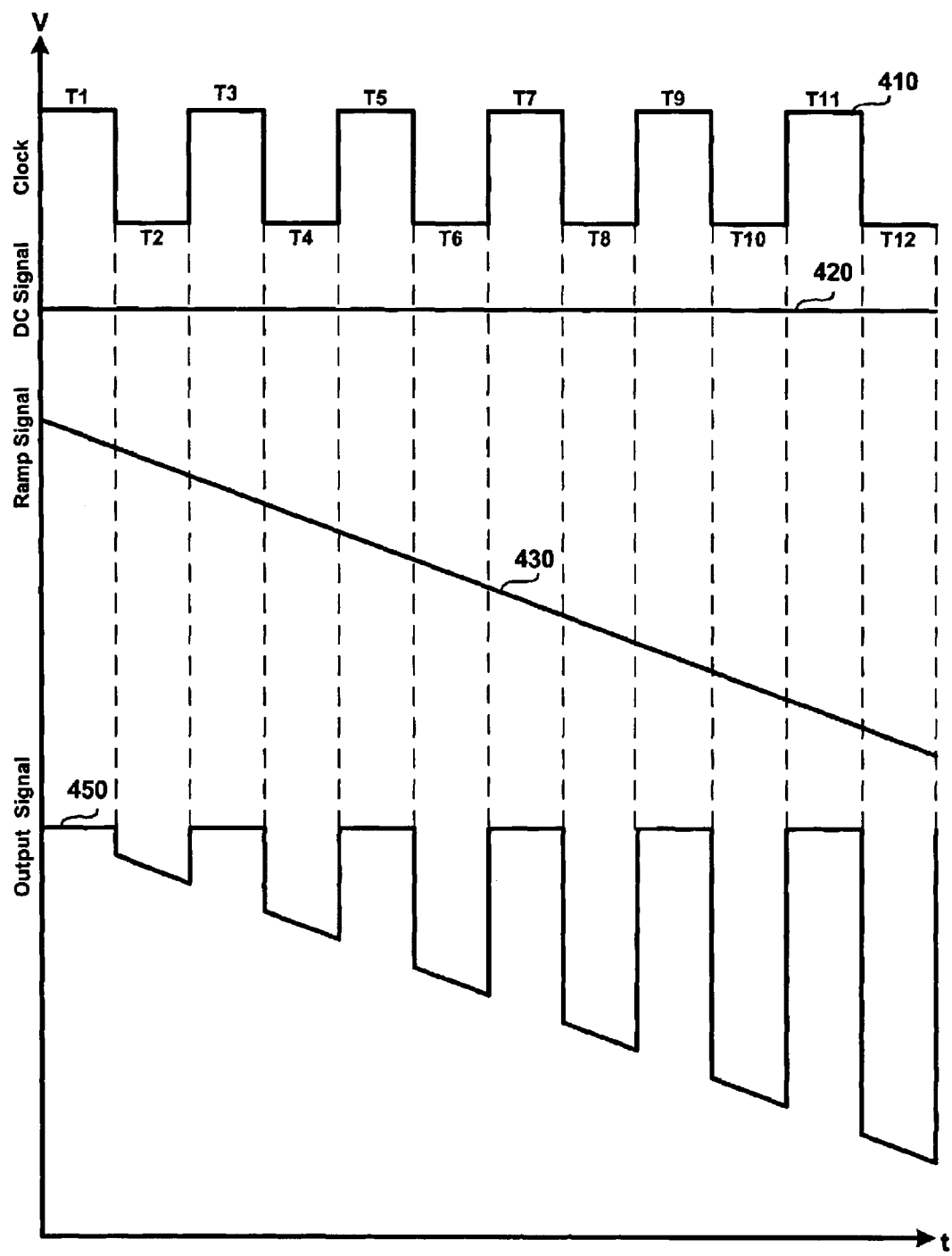
FIG. 4 is a timing diagram illustrating a waveform generated in an embodiment implemented according to an aspect of the present invention.

FIG. 4 is a timing diagram illustrating the manner in which a CCD waveform is generated in an embodiment of the present invention. FIG. 4 is shown containing four signals—clock signal 410, DC signal 420, ramp signal 430 and CCD waveform 450. The generation of CCD waveform 450 is described below.

DC signal 420 and ramp signal 430 may respectively represent the signals received on paths 313 and 324. Clock signal 410 is shown at high level during t1, t3, t5, t7, t9, and t11, and at low level during t2, t4, t6, t8, t10 and t12. The time duration of each of t1–t12 may be computed based on the frequency of operation of a CCD device. For illustration, SW 354 is assumed to be closed (conducting) at high levels of clock signal 410, and SW 358 is assumed to be closed during low levels.

Accordingly, the CCD waveform 450 is shown with voltage level equaling DC signal 420 during t1, t3, t5, t7, t9, and t11 of the clock signal, and equaling ramp signal 430 during t2, t4, t6, t8, t10 and t12. Thus, an aspect of the present invention enables generating a signal having a DC signal level (fixed) periodically and different signal levels (corresponding to ramp signal level) in other durations. The description is continued with reference to a circuit diagram which illustrates the details of some components of FIG. 3 in further detail in an embodiment of the present invention.

6. Circuit Diagram

Figure 5:
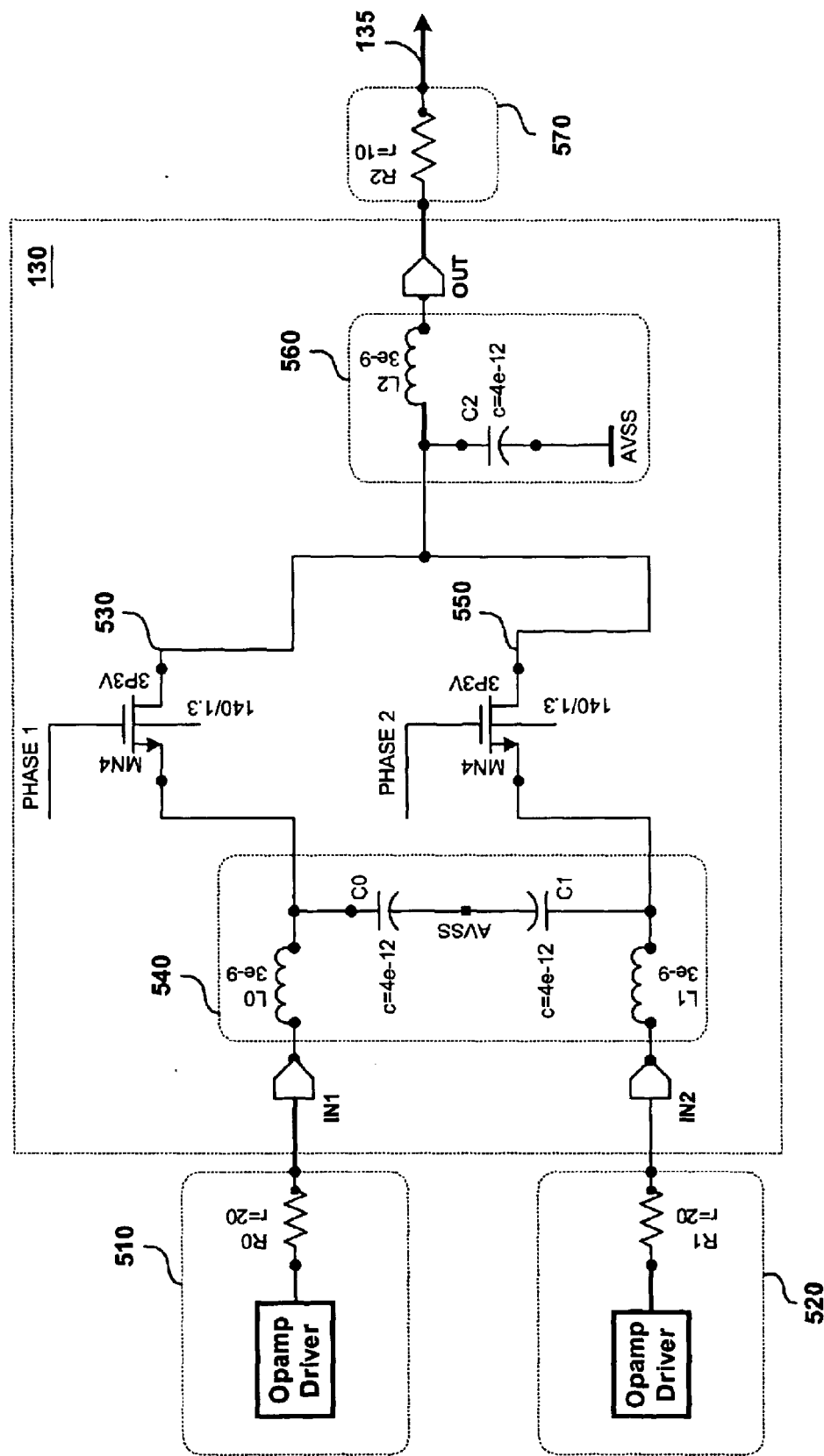
FIG. 5 is a circuit diagram illustrating in further detail the manner in which some of the components of the waveform generator are implemented according to an aspect of the present invention.

FIG. 5 is a circuit diagram illustrating the details of multiplexor 350 and parasitic block 390 in an embodiment of the present invention. The values of various capacitors, resistors and inductors is shown merely for illustration. The components of FIG. 5 are described below in further detail.

In general, portions 510, and 520 represent the buffers driving the two inputs of the waveform generator. Block 540 represents the parasitics associated with bond wire and the bond pad of the silicon implementation. Portion 560 represents the parasitic block 390. Block 570 represents a damping resistance to damp the ringing of the output CCD waveform. Switches 354 and 358 are respectively implemented using transistors 530 and 550. In an embodiment, the two transistors are implemented as core transistors (having low breakdown voltage) and a high speed of operation due to low parasitics.

Such a design may enable the CCD generator to generate CCD waveforms at a high frequency (e.g., 20 Nano-seconds period) to be generated. Substantially high accuracy (14 bit precision) may also be attained as corresponding accurate types of sources are used for the two types of portions in generating the CCD waveforms.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of generating a waveform having a constant level periodically and a plurality of different levels in other durations, said method comprising:

receiving a first input signal having said constant level and a ramp signal having said plurality of different levels in other durations; and selecting said first input signal periodically and said ramp signal in said other durations to generate said waveform.

2. The method of claim 1, wherein said first input signal is selected in alternative durations, wherein said alternative durations and corresponding ones of said other durations are contiguous such that said wave form is also continuous in time domain.

3. The method of claim 2, wherein said ramp signal comprises a data signal, and wherein said waveform comprises a CCD waveform.

4. The method of claim 3, wherein said CCD waveform is used to test a CDS (correlated double sampling) sampler at a high frequency.

5. An apparatus for generating a waveform having a constant level periodically and a plurality of different levels in other durations, said apparatus comprising:

means for receiving a first input signal having said constant level and a ramp signal having said plurality of different levels in other durations; and means for selecting said first input signal periodically and said ramp signal in said other durations to generate said waveform.

6. The apparatus of claim 5, wherein said first input signal is selected in alternative durations, wherein said alternative durations and corresponding ones of said other durations are contiguous such that said wave form is also continuous in time domain.

7. The apparatus of claim 6, wherein said second signal comprises a data signal, and wherein said waveform comprises a CCD waveform.

8. The apparatus of claim 7, wherein said CCD waveform is used to test a CDS (correlated double sampling) sampler at a high frequency.

9. A waveform generator for generating a waveform having a constant level periodically and a plurality of different levels in other durations, said waveform generator comprising:

a multiplexor receiving a first input signal having said constant level and a ramp signal having said plurality of different levels in other durations, said multiplexor selecting said first input signal periodically and said second signal in said other durations to generate said waveform.

10. The waveform generator of claim 9, wherein said first input signal is selected in alternative durations, wherein said alternative durations and corresponding ones of said other durations are contiguous such that said wave form is also continuous in time domain.

11. The waveform generator of claim 10, wherein said ramp signal comprises a data signal, and wherein said waveform comprises a CCD waveform.

12. The waveform generator of claim 11, wherein said CCD waveform is used to test a CDS (correlated double sampling) sampler at a high frequency.

13. The waveform generator of claim 12, wherein said high frequency corresponds to a period of less than 30 nano-seconds for said CCD waveform.

14. The waveform generator of claim 9, wherein said multiplexor comprises a first switch and a second switch respectively coupled to receive said first input signal and said ramp input signal, said first switch being operated to be in a closed state periodically and said second switch being operated to be in said closed state in said other durations.

15. The waveform generator of claim 14, wherein each of said first switch and said second switch is implemented using a respective core transistor having a low breakdown voltage and high speed.

* * * * *